US005739705A

United States Patent [19]

John

[11] Patent Number: 5,739,705

[45] Date of Patent: Apr. 14, 1998

[54] HYSTERESIS COMPARATOR CIRCUIT FOR USE WITH A VOLTAGE REGULATING CIRCUIT

[75] Inventor: Udo John, Poing, Germany

[73] Assignee: SGS-Thomson Microelectronics GmbH, Grasbrunn, Germany

[21] Appl. No.: 746,768

[22] Filed: Nov. 15, 1996

[30] Foreign Application Priority Data

Nov. 16, 1995 [DE] Germany ........................ 195 42 823.4

[51] Int. Cl.[6] ........................... H03K 5/153; H03K 3/037

[52] U.S. Cl. ........................................ 327/74; 327/205

[58] Field of Search .................................. 327/68, 72, 73, 327/74, 205, 148, 157, 390, 536, 589

[56] References Cited

U.S. PATENT DOCUMENTS

| | | | |
|---|---|---|---|
| 4,259,601 | 3/1981 | Stein | 327/73 |
| 4,375,598 | 3/1983 | Sakai | 327/74 |
| 4,602,169 | 7/1986 | Shimizu | 327/73 |
| 5,262,682 | 11/1993 | Mitsuya et al. | 327/73 |
| 5,640,118 | 6/1997 | Drouot | 327/205 |

FOREIGN PATENT DOCUMENTS

| | | | |
|---|---|---|---|
| 3723579 C1 | 7/1987 | Germany | G05F 1/56 |

OTHER PUBLICATIONS

"Fast Mostek ROM has 350–ns access," *Electronics*, Sep. 16, 1997, pp. 42 and 44.

*Primary Examiner*—Toan Tran
*Attorney, Agent, or Firm*—David V. Carlson; Seed and Berry LLP

[57] ABSTRACT

A hysteresis comparator circuit using, for a virtually power-free detection of the voltage value to be subjected to a comparison, a differential stage utilizing on one end load transistors and on the other hand a negative feedback stage and preferably a current mirror stage. The control electrode of one load transistor is fed with the voltage to be used for the comparison. The control electrode of the other load transistor is fed with a reference voltage on the basis of which this load transistor forms a constant load impedance. The second load transistor has a third load transistor connected in parallel thereto, which in response to the output signal of the comparator is either conducting or blocking, so that in accordance with the output signal of the comparator, an additional load impedance is connected in parallel to the impedance of the second load transistor or no such connection is made.

29 Claims, 3 Drawing Sheets

HYSTERESIS COMPARATOR CIRCUIT FOR USE WITH A VOLTAGE REGULATING CIRCUIT

TECHNICAL FIELD

The invention relates to a hysteresis comparator circuit for use as a comparator stage and actuating signal generator of an electric voltage regulating circuit having a voltage source delivering the voltage to be regulated, and to a regulating circuit having such a comparator circuit.

BACKGROUND OF THE INVENTION

There are electric circuits for which a potential must be made available that is above the potential of the supply voltage source. An example thereof are circuits having MOS transistors which are provided on the side of high supply voltage potential of their circuit and the gate electrode of which, when they are to be switched to the conducting state, has to be fed with a gate potential that is higher than the high supply voltage potential. This occurs in some CMOS circuits. For making available such a high gate potential voltage increasing circuits are employed. Bootstrap circuits are used for alternating current circuits. Charge pumps or voltage pumping circuits are utilized for direct current applications.

Such voltage pumping circuits have a charge voltage capacitor that is charged approximately to twice the value of the supply voltage source with the aid of the alternating voltage of a pumping oscillator that is usually made available in the form of a rectangular wave pulse sequence. The latter results in electromagnetic radiation (EMR) that may be quite disturbing particularly in direct current voltage applications. It is thus necessary to take measures for counteracting such EMR.

A reduction of EMR may be achieved by reducing the frequency of the pumping pulse sequence and/or by purposeful reduction of the edge steepness of the pumping pulses. The main disadvantage of these measures, however, consists in that they only reduce the problem of EMR, but do not eliminate it.

DE 37 23 579 C1 reveals a series voltage regulator comprising a comparator circuit containing a differential stage having a load stage connected upstream thereof and a current mirror circuit connected downstream thereof. With this known series voltage regulator the comparator circuit serves to compare output voltage and input voltage of the regulator in order to turn off a control transistor acting on the regulator series branch when the input voltage of the regulator drops below a nominal regulator output voltage in order to thus mitigate functional disorders caused by voltage dips on the input side.

Electronics, Sep. 16, 1976, pages 42 and 44, discloses a voltage pumping circuit in which the pumping voltage is regulated to a predetermined value, with a pumping oscillator being turned on and off to this end in accordance with the output signal of a comparator.

SUMMARY OF THE INVENTION

It is thus an object of the present invention to make available a circuit arrangement with which the problem of EMR can be eliminated completely in case of such pumping circuits.

The basic idea for meeting this object is as follows: when the gate of the NMOS transistor mentioned is charged to the required pumping voltage, the pumping operation is terminated so that as of then the pumping frequency causing EMR is no longer present. Due to the fact that an MOS transistor has a very high gate input resistance, the pumping voltage can be maintained for a relatively long time. To ensure this effect, it is necessary to make the regulating operation of the pumping voltage in essence free from power dissipation so that the capacitor holding the pumping voltage is not burdened, i.e., discharged, by the regulating circuit, which would cause the beginning of a new pumping operation with new occurrence of EMR.

The realization of this idea takes place with the aid of a comparator circuit which, for virtually power-free detection of the voltage value to be subjected to a comparison, makes use of a differential stage employing on one end load transistors and on the other end a negative feedback stage and preferably a current mirror stage between differential stage and negative feedback stage. The control electrode of a first load transistor, which is a transistor with high input impedance, e.g., an MOS transistor, is fed with the voltage to be subjected to said comparison. The control electrode of a second load transistor is fed with a reference voltage on the basis of which this load transistor forms a constant load impedance. The second load transistor has a third load transistor connected in parallel thereto which, in accordance with the output signal of the comparator, is either conducting or blocking, so that in accordance with the output signal of the comparator, an additional load impedance is connected in parallel to the impedance of the second load transistor or no such connection is made.

For realizing this idea in connection with a voltage regulating circuit, the invention makes available a hysteresis comparator circuit which may be utilized in an electric regulating circuit, in particular a regulating circuit for the pumping voltage of a pumping voltage circuit.

The following detailed description and associated illustrations will make the features of the invention more evident.

DETAILED DESCRIPTION OF THE INVENTION

Figure 1:
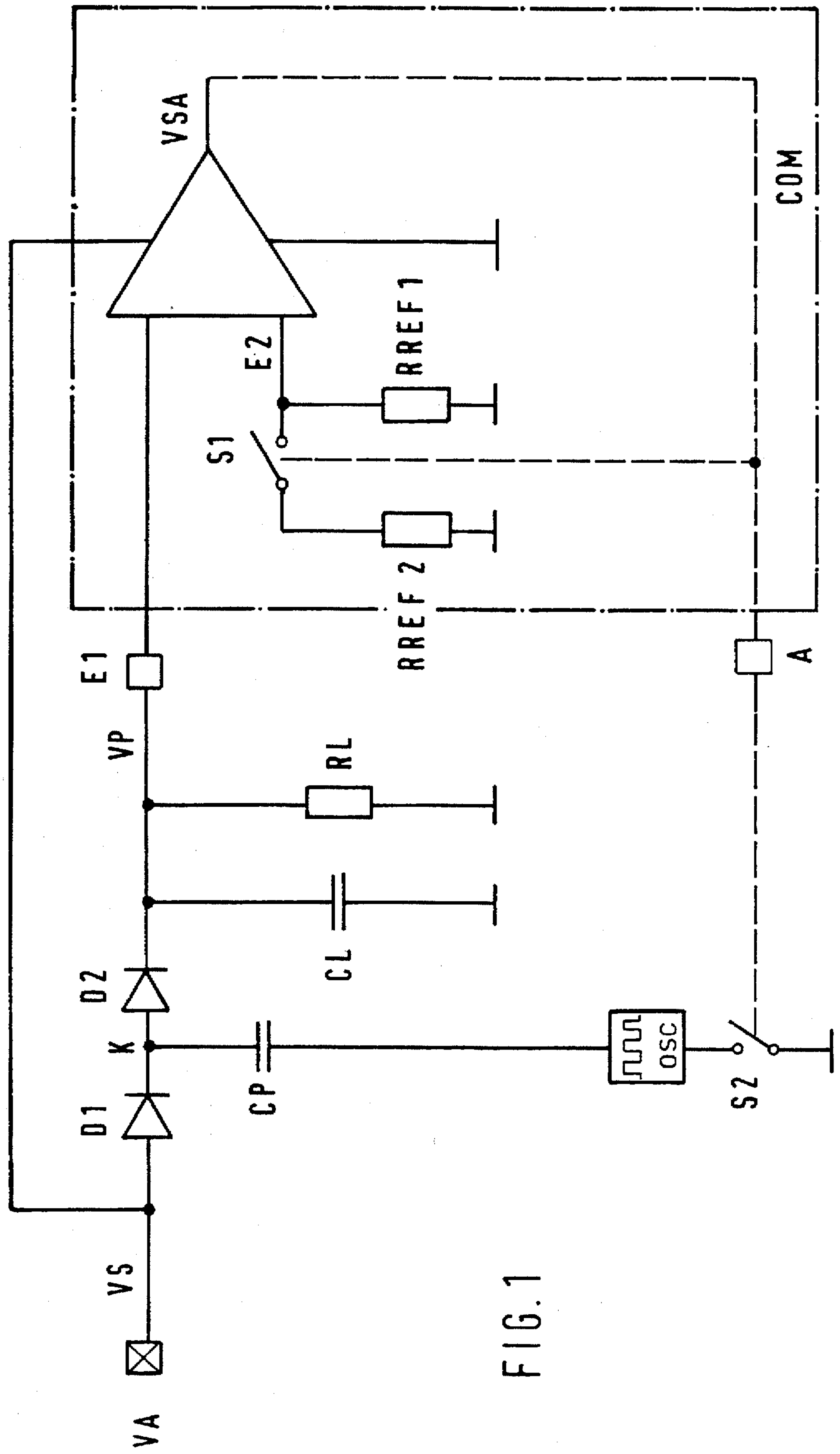
FIG. 1 is an electric circuit diagram, partly in block representation, of a pumping voltage regulating circuit according to the invention.

FIG. 1 shows a circuit diagram of a pumping voltage regulating circuit comprising a supply voltage terminal VA fed with the high potential VS of a supply voltage source. Between supply voltage terminal VA and a first input E1 of a comparator COM there is provided a series connection of two diodes D1 and D2. The anode of D1 is connected to VA and the cathode of D2 is connected to E1. A second input E2 of comparator COM is connected to a parallel connection of two reference resistors RREF1 and RREF2. The latter are connected at one end to ground potential and on the other end to E2, with RREF1 being connected thereto directly and RREF2 via a first switch S1. A circuit node K between the two diodes D1 and D2 is connected to one side of a pumping capacitor CP having its other side connected to an output of an oscillator OSC which, when a second switch S2 is switched to the conducting state, delivers a pumping pulse sequence having a pumping frequency. Between diode D2 and first input E1 there is provided a parallel connection of a load capacitor CL and a load resistor RL forming the input capacitance and the input resistance of the load to be fed with the pumping voltage, and forming in case of said NMOS transistor the gate capacitance and the gate input resistance thereof, respectively.

When switch S2 is closed, the pumping pulse sequence, in a manner known per se, effects charging of pumping capacitor CP to a pumping voltage VP that is about twice as large as the supply voltage VS. When, after the desired pumping voltage is reached, switch S2 is opened for terminating the pumping operation, the pumping voltage is discharged across load resistor RL. When the pumping voltage VP has dropped below a predetermined threshold value, a new pumping operation is started by closing switch S2, i.e., by switching the same to the conducting state.

The time when a pumping operation may be terminated and when a new pumping operation is necessary is determined with the aid of comparator COM, and it is dependent upon the latter's output signal present at a comparator output A whether this output signal switches switch S2 to the conducting or non-conducting state. For obtaining a two-level control with respect to the pumping voltage VP, the comparator is formed with a hysteresis behavior. To this end the two reference resistors RREF1 and RREF2 are provided of which, depending on the position of switch S1, only reference resistor RREF1 or the parallel circuit of both reference resistors RREF1 and RREF2 becomes effective. Due to the fact that the input resistance RL of said NMOS transistor is very high, the time intervals between the times at which a respective pumping operation is carried out by closing of switch S2 may be very large when the input resistance of input E1 of comparator COM is very high as well. Between these long time intervals there is no pumping voltage operation taking place, and the pumping oscillator may thus be mined off so that no EMR takes place between these long time intervals.

Figure 2:
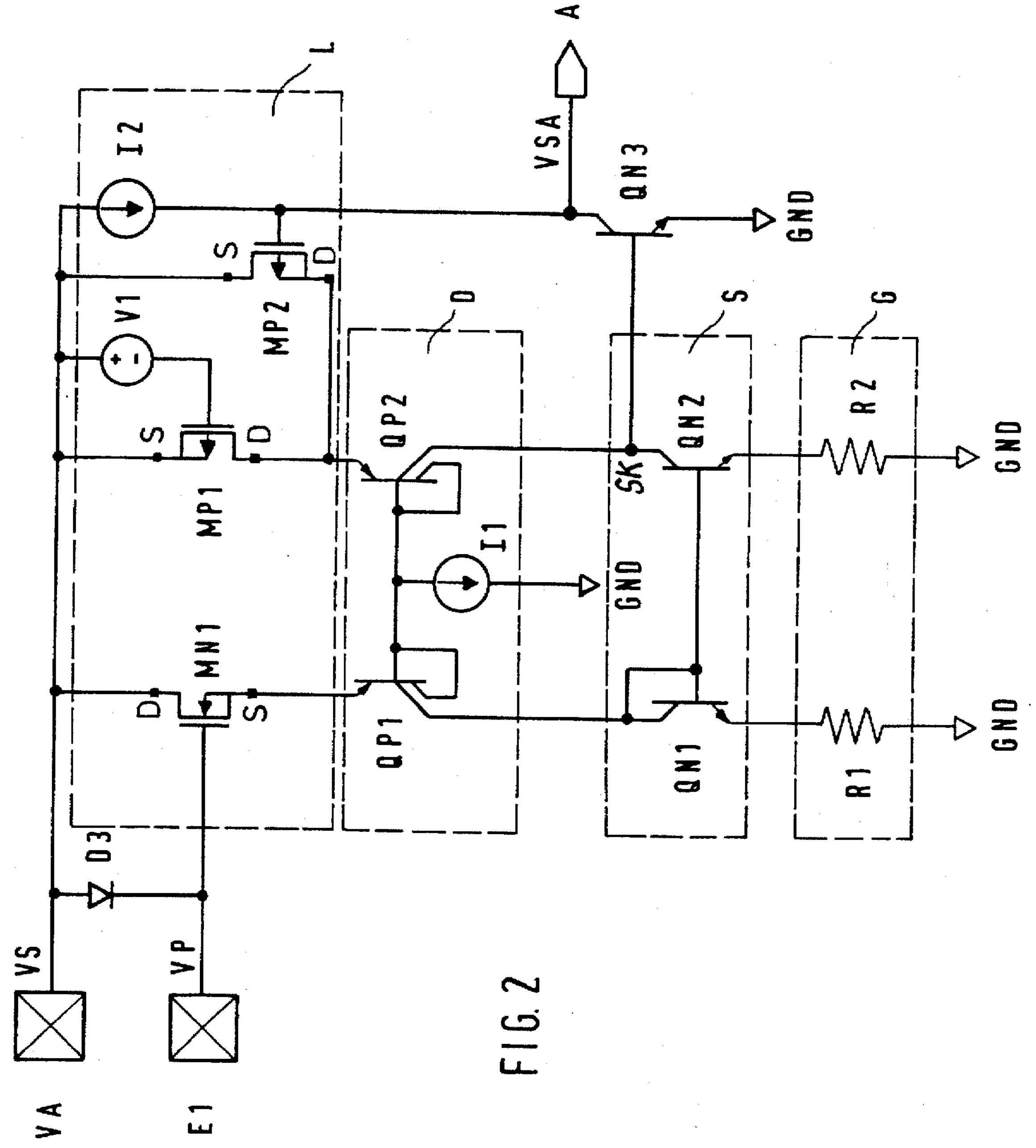
FIG. 2 is a circuit diagram of a hysteresis comparator circuit that may be utilized with the pumping voltage regulating circuit of FIG. 1.

An embodiment of a hysteresis comparator according to the invention, which causes as little burden to the pumping voltage source as possible, is shown in FIG. 2 and comprises the part of the circuit surrounded in FIG. 1 by broken lines.

The hysteresis comparator COM according to FIG. 2 comprises a cascade connection between a supply voltage terminal VA for supplying the positive supply voltage VS and a ground terminal GND constituting the negative pole of the supply voltage source, a differential stage D, a load impedance stage L located on the high potential side of D, a negative feedback stage G located on the low potential side of D, and a current mirror stage S between D and G.

Differential stage D comprises a first differential stage transistor QP1, a second differential stage transistor QP2 and a first current source I1. QP1 and QP2 are each provided in the form of a bipolar PNP multicollector transistor with two collectors. The base terminals of QP1 and QP2 are commonly connected to GND via first current source I1. One of the two collectors of each of the two differential stage transistors QP1 and QP2 is connected to the common base terminal.

The current mirror stage S comprises a current mirror circuit having a current mirror diode QN1 in the form of a bipolar NPN transistor connected as a diode and a current mirror transistor QN2 in the form of a bipolar NPN transistor. As usual with current mirrors, the base terminals of QN1 and QN2 are connected to each other.

The negative feedback stage G comprises a first negative feedback resistor R1 and a second negative feedback resistor R2.

The load impedance stage L comprises a first load transistor MN1 in the form of an N-channel MOS transistor, a second load transistor MP1 in the form of a P-channel MOS transistor and a third load transistor MP2 in the form of a P-channel MOS transistor. In addition thereto, load impedance stage L comprises a reference voltage source V1 connected between the gate of MP1 and VS, and a current source I2 connected between the gate of MP2 and VS.

MN1, QP1, QN1 and R1 constitute a first series connection, while MP1, QP2, QN2 and R2 constitute a second series connection. R1 and R2 constitute negative feedback impedances for QP1 and QP2. MN1 constitutes a load impedance for QP1. Load transistors MP1 and. MP2 connected in parallel constitute together a load impedance for QP2.

Between QP2 and QN2 there is provided a circuit node SK having connected thereto the base of a bipolar NPN switching transistor QN3. The emitter thereof is connected to OND, while its collector is connected both to the gate of MP2 and to the second current source I2. A common connecting point between current source I2, gate of MP2 and collector of QN3 constitutes the comparator output A.

The load impedance established by first load transistor MN1 is dependent on the pumping voltage VP applied to first comparator input E1. The load impedance at the emitter of QP2, which is formed by the parallel connection of the two load transistors MP1 and MP2, is dependent upon the potential at the comparator output. MP1, by means of reference voltage source V1, is permanently held in a specific state of conduction, i.e., permanently has a constant predetermined impedance which in the following is also referred to as first reference load impedance. Third load transistor MP2 is switched to the conducting or non-conducting state depending on the potential arising at comparator output A. The impedance thereof, which in the following is also referred to as second reference load impedance, is thus dependent on the potential at comparator output A. When MP2 is switched to the non-conducting state, the load impedance effective at the emitter of QP2 is constituted virtually only by the constant impedance of MP1. When MP2 is switched to the conducting state, the load impedance effective at the emitter of QP2 is formed by the parallel connection of first and second reference load impedance. Depending on the potential at comparator output A, a lower or a higher load impedance is thus effective at the emitter of QP2.

Between the supply voltage terminal VA and the gate of MN1, there is provided a protective diode D3 for protection of the gate-source path of MN1 against overvoltages that may be supplied via supply voltage terminal VA.

In FIG. 1, the impedance of conducting load transistor MP2 is represented by RREF2, whereas the impedance of permanently conducting load transistor MP1 is represented by RREF1. Switch S1 in FIG. 1 is represented by load transistor MP2 operating as a switch.

The mode of operation of the comparator circuit shown in FIG. 2 will now be elucidated with the aid of FIG. 3, starting from a condition in which the pumping voltage VP is below the desired voltage value, which is the case at first when the voltage supply is mined on. This time section is marked as T1 in FIG. 3.

In order to obtain an increase in pumping voltage VP, the pumping pulse sequence must be able to reach pumping capacitor CP in FIG. 1. A potential value must thus be present at comparator output A which controls switch S2 in FIG. 1 to the conducting state and thus controls the oscillator to the switched-on state.

The impedance of load transistor MN1 is dependent upon the instantaneous voltage value of pumping voltage VP present at comparator input E1. This pumping voltage determines the value of the gate-source voltage VGS of MN1. Provided that VP is sufficiently high for controlling load transistor MN1 to the conducting state, the load impedance formed by MN1 is inversely related to the pumping voltage VP. That is, the lower the pumping voltage VP is, the higher the load impedance formed by MN1, and conversely the higher the pumping voltage VP is, the lower the load impedance formed by MN1 will be. The respective load impedance formed by MN1 thus represents a measure for the respective value of the pumping voltage VP present. Due to the fact that pumping voltage VP is delivered to the gate of an MOS transistor, detection and evaluation of the instantaneous or actual value of the pumping voltage VP take place with virtually no power drain. The pumping voltage source, namely pumping capacitor CP, thus is virtually not affected or discharged by this type of actual value detection.

The impedance value of MN1, which constitutes the respective actual value of the pumping voltage, is compared to the reference impedance as formed, in accordance with the switching state of third load transistor MP2, either by the load impedance of MP1 alone or by the parallel connection of the load impedances of MP1 and MP2. As the pumping voltage VP increases after switching on the supply voltage and the load impedance formed by MN1 thus decreases in corresponding manner, the load impedance effective at the emitter of QP2 must be correspondingly lower than the impedance of MN1 which is present as long as the pumping voltage has not yet reached the desired voltage value or specified value. The comparator circuit, during the time which pumping voltage VP is still below the desired value, thus behaves in asymmetrical manner since different load impedances are offered to the two differential stage transistors QP1 and QP2 of differential stage D. Due to the fact that the load impedance effective at the emitter of QP2 is lower than the load impedance effective at the emitter of QP1, more current flows through QP2 than through QP1. The current delivered from the collector of QP2 at circuit node SK is thus higher than the current delivered to circuit node SK from the collector of QP1 via current mirror stage S. In addition thereto, the voltage drop at negative feedback resistor R2 is larger than the voltage drop at negative feedback resistor R1, which results in an increase of the potential at circuit node SK. These two effects cause switching on of switching transistor Q3, so that a low potential appears at the collector thereof, which results in conduction of third load transistor MP2. Thus, the parallel connection of the first reference load impedance formed by MP1 and the second reference load impedance formed by conducting MP2 becomes effective at the emitter of QP2.

Since in the condition of too low pumping voltage VP, a low potential is present at the collector of QN3 and thus at comparator output A, the entire regulating circuit is to be designed such that, with low potential at comparator output A, a pumping pulse sequence is applied to pumping capacitor CP.

During its increase, the pumping voltage VP at some time becomes so high that the value of the impedance of MN1 has dropped to the impedance value resulting from the parallel connection of first and second reference load impedances. In that moment, the comparator circuit reaches a symmetrical behavior. When upon slight further increase of the pumping voltage value this symmetrical behavior is lost again, comparator output A assumes the other one of the two conditions possible: comparator output A assumes a high potential. This is due to the fact that the load impedance value effective at the emitter of QP1 has become lower than the load impedance value effective at the emitter of QP2 and, accordingly, the current flowing through QP1 has become higher than the current flowing through QP2. The current balance at circuit node SK is reversed in corresponding manner and, due to the smaller current through QP2, the voltage drop across negative feedback resistor R2 and thus the potential at circuit node SK has dropped. As a consequence thereof, switching transistor QN3 is blocked. This leads on the one hand to the already mentioned high potential value at comparator output A and on the other hand to blocking of the third load transistor MP2. As of this moment of time, only the constant, first reference load impedance established by MP1 is effective at the emitter of QP2.

Due to the transition of the potential at comparator output A to a high potential value, further application of pumping pulses to the pumping capacitor CP in FIG. 1 is prevented.

Figure 3:
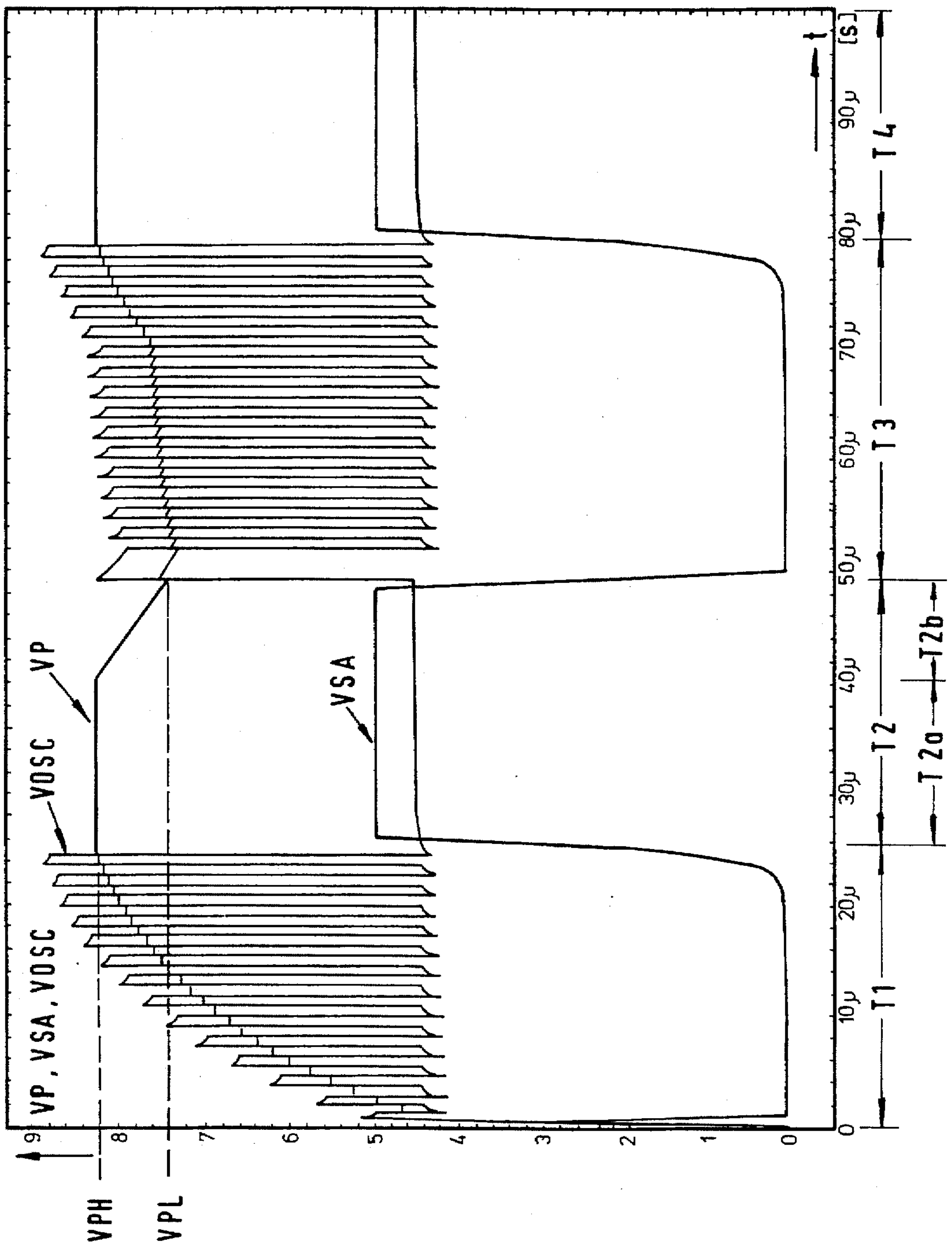
FIG. 3 are voltage patterns arising with the comparator circuit according to FIG. 2.

This condition is reached at the end of time period T1 in FIG. 3. During the following time period T2, no pumping pulses are present, the pumping voltage VP remains virtually constant during a first portion T2*a* of time section T2, and the potential at comparator output A, designated VSA in FIG. 3, has a high value.

Due to the fact that MOS transistors do not have an infinitely high gate-source input resistance, either, and possibly due to other effects, a gradual discharge of pumping capacitor CP and thus a gradual drop of the pumping voltage value may take place. When the pumping voltage is used to control the gate of an MOS transistor and when the actual value measurement of the pumping voltage is carried out in accordance with the comparator circuit according to the invention, by applying the pumping voltage to the gate of an MOS transistor, the period of time during which the pumping voltage value obtained at the end of time period T1 has dropped notably, normally is very long. However, to be able to demonstrate by way of FIG. 3 what happens when the pumping voltage value has dropped by a predetermined amount after having reached the desired value, it is assumed in the second portion T2*b* in FIG. 3 that the pumping voltage value drops rapidly. This leads to a corresponding increase in the load impedance formed by MN1. When this load impedance has increased to the first reference load impedance formed by MP1 and is increasing therebeyond even just very slightly, the comparator circuit is reversed again to the condition considered at the beginning, in which the potential at comparator output A assumes a low potential value. This condition is reached at the end of time period T2 and has the effects that pumping capacitor CP now has pumping pulses applied thereto again and MP2 is again switched to a conducting state. During a time period designated T3 in FIG. 3, the pumping voltage value increases again due to this application of pumping pulses to CP, up to the end of time period T3 at which the value of the load impedance established by MN1 has dropped again to the value of the reference load impedance formed by MP1 and conducting MP2 together, changes to the condition of high potential at comparator output A, which results in blocking of the application of further pumping pulses to CP. This condition lasts during time period T4 in FIG. 3.

The pumping voltage regulating circuit shown in FIG. 1 and containing the comparator circuit according to FIG. 2 thus has the effect of a two-level control between a high pumping voltage threshold value and a low pumping voltage threshold value designated VPH and VPL, respectively, in FIG. 3. The hysteresis resulting in this two-level control is effected by controllably connecting and clearing the impedance formed by MP2 to and from, respectively, the permanent constant load impedance established by MP1.

The comparator circuit according to FIG. 2 was considered hereinbefore to be part of a pumping voltage regulation circuit. However, this comparator circuit can be employed in advantageous manner for other purposes as well. It is suitable for any application in which an input quantity is to be compared to a hysteresis reference quantity in a virtually power-free manner. By applying the quantity to be measured to the-gate of an MOS transistor, such a virtually power-free measurement of the quantity of interest or to be measured becomes possible.

With the comparator circuit according to the invention it is not only possible to obtain, in a virtually power-free manner, a measurement of the voltage value to be monitored or regulated, but it is also easily possible to program the threshold value determining the regulating operation by selecting the voltage value of reference voltage source V1. In case of a comparator circuit of this type, which is designed in the form of an integrated circuit, it would be possible to provide several reference voltage sources which could be made selectable by programming, depending on the threshold value required for a particular case.

The use of multicollector transistors for QP1 and QP2 in which one collector each is connected to the base, results in a high transconductance or steepness due to the resulting non-linear diode behavior of each of the two differential transistors QP1 and QP2 at the emitters thereof, so that it is possible by means of differential stage D to ascertain very small voltage differences and thus very slight differences in the load impedances acting on the emitter of QP1 and on the emitter of QP2, respectively. With identical drain currents, the drain-source voltage of the first load transistor MN1 must thus be equal to the drain-source voltage of the second load transistor MP1 in order to obtain balanced conditions at current mirror stage S. The gate-source voltage of MP1 is established by the reference voltage V1 of the reference voltage source. In simplified equations for non-saturated CMOS transistors, the threshold value potential necessary for reaching the high potential at comparator output A may be calculated as a multiplication factor a of reference voltage V1, with the exceptions listed hereinafter:

$$I_{D\,MN1}=I_{D\,MP1}$$

$$V_{DS\,MN1}=V_{DS\,MP1}=V_{DS}$$

$$V_{th\,MN1}=V_{th\,MP1}=V_{th}$$

$$V_{GS\,MN1}=a*V1$$

$$V_{GS\,MP1}=V1$$

$$\beta_{MN1}=V1-V_{th}-V_{DS}*0.5$$

$$\beta_{MP1}=a*V_1-V_{th}-V_{DS}*0.5$$

$$\beta=Const.*W/L$$

In the above formulae $I_{D\,MN1}$, $I_{D\,MP1}$=drain current of MN1 and MP1, respectively $V_{DS\,MN1}$, $V_{DS\,MP1}$=drain-source voltage of MN1 and MP1, respectively $V_{th\,MN1}$, $V_{th\,MP1}$=threshold voltage of MN1 and MP1, respectively $V_{GS\,MN1}$, $V_{GS\,MP1}$=gate-source voltage of MN1 and MP1, respectively V1=reference voltage of reference voltage source β=transconductance (steepness) of an MOS transistor $\beta_{MN1}$, $\beta_{MP1}$=transconductance of MN1 and MP1, respectively W=channel width L=channel length For threshold value determination the ratio of the transconductances of MN1 and MP2 has to be adjusted by means of the respective W/L ratio. The threshold value may thus be selected as a function of the channel widths and channel lengths of the two CMOS transistors MN1 and MP1.

Hysteresis may be achieved by connecting the third load transistor MP2 parallel to second load transistor MP1, with the channel type of said third load transistor MP2 being also opposite to that of MN1 and said transistor being a transistor with P-channel. The amount of the hysteresis may also be chosen by selection of the length and the width of the channel.

It is not necessary in the scope of the invention to select the transistors of the comparator circuit such that they are of the channel type or conductivity type as indicated in FIG. 2. When instead of a positive pumping voltage, as assumed in FIG. 2, a negative pumping voltage is required, the comparator circuit depicted in FIG. 2 may be reversed in so far as the load transistors are shifted to the ground side (GND) and the opposite channel type is selected, with transistors of opposite conductivity type being selected in corresponding manner for the transistors of differential stage D and current mirror stage S.

It is claimed:

1. A hysteresis comparator circuit for ascertaining in a virtually power-free manner a voltage value to be used for comparison, comprising:

load stage with load transistors;

a differential stage coupled to the load stage; and an impedance stage coupled to the differential stage;

wherein a control electrode of a first lead transistor, which is a transistor with high input impedance, having an input voltage applied thereto that is to be used for the comparison, and a control electrode of a second load transistor having a reference voltage applied thereto on the basis of which the second load transistor forms a constant load impedance, a third load transistor connected in parallel with the second load transistor, the third load transistor conducting or blocking depending on an output signal of the comparator circuit, so that in accordance with the output signal of the comparator circuit, an impedance of the second load transistor has an additional load impedance connected in parallel thereto or no such connection is made.

2. The comparator circuit according to claim 1, further including a current mirror stage connected between the differential stage and the impedance, stage.

3. The comparator circuit of claim 1 wherein said first load transistor is an MOS transistor.

4. The comparator circuit of claim 1 wherein the three load transistors are each constituted by an MOS transistor with gate electrodes forming the control electrodes thereof.

5. The comparator circuit of claim 1 wherein the first load transistor is of a different channel type than the second and third load transistors.

6. The comparator circuit of claim 1 wherein a control electrode of the third load transistor is coupled to the comparator output.

7. The comparator circuit of claim 1 wherein the comparator output is coupled to a connecting point between a transistor of the differential stage transistor and an associated impedance in the impedance stage.

8. A hysteresis comparator circuit for use as a comparator stage and actuating signal generator of an electric voltage regulating circuit having a voltage source which delivers a voltage to be regulated and which has an output voltage that is variable by means of an actuating signal delivered by an output of the comparator circuit, said comparator circuit:

(a) comprising a comparator input connected to have the output voltage of the voltage source applied thereto and the comparator output delivering the actuating signal;

(b) being fed by a supply voltage source having a first supply voltage pole and a second supply voltage pole;

(c) comprising a differential stage having a first differential stage transistor and a second differential stage transistor each having a control electrode, a first main path electrode and a second main path electrode, (c1) the control electrodes thereof being coupled jointly to the second supply voltage pole, (c2) the first main path electrodes thereof being connected via a first load impedance and a second load impedance, respectively, to the first supply voltage pole each, and (c3) the second main path electrodes thereof being each coupled via an impedance to the second supply voltage pole;

and wherein:

(d) the first load impedance is produced by a first load transistor which is a transistor having a high input impedance and which has a control electrode coupled to the comparator input such that the first load impedance is dependent on the output voltage of voltage source; and (e) the second load impedance includes a parallel connection with a second load transistor and a third load transistor, (e1) with a reference voltage source being connected between a control electrode of the second load transistor and the first supply voltage pole, said reference voltage source controlling the second load transistor to the conducting state such that it has a predetermined first reference load impedance, and (e2) with the third load transistor being switched to a conducting or blocking state under the control of the actuating signal at comparator output, such that the third load transistor is switched to a blocking state when a first actuating signal occurs at the comparator output when the increasing output voltage of the voltage source reaches an upper threshold value, and is switched to a conducting state when a second actuating signal occurs at the comparator output when the decreasing output voltage of the voltage source reaches a lower threshold value, thereby forming a predetermined second reference load impedance.

9. The comparator circuit of claim 8 wherein the two differential stage transistors are constituted by a bipolar transistor each.

10. The comparator circuit of claim 9 wherein the two differential stage transistors are each connected on an emitter side to the associated load impedance and on a collector side to the associated impedance in the impedance stage.

11. The comparator circuit of claim 8 wherein the two differential stage transistors are each constituted by a multicollector transistor, the first collector being coupled to the respectively associated impedance in the impedance stage and the second collector being coupled to a base electrode of the respective differential stage transistor.

12. The comparator circuit of claim 8 wherein the control electrodes of the two differential stage transistors are commonly connected via a first current source to the second supply voltage pole.

13. The comparator circuit of claim 8 wherein a current mirror circuit is connected between the two differential stage transistors and the two impedances in the impedance stage, said current mirror circuit having a current mirror diode connected between the first differential stage transistor and the first impedance in the impedance stage and having a current mirror transistor connected between the second differential stage transistor and the second impedance in the impedance stage.

14. The comparator circuit of claim 13 wherein the comparator output is coupled to a connecting point between one differential stage transistor and the associated current mirror transistor.

15. The comparator circuit of claim 14 wherein a switching transistor is connected between the connecting point and the comparator output, said switching transistor having a control electrode connected to the connecting point, a main path connected between the control electrode of the third load transistor and the second supply voltage pole and a main path electrode, which is connected to the control electrode of the third load transistor, to the comparator output.

16. The comparator circuit of claim 15 wherein the switching transistor is of a bipolar transistor having a conductivity type opposite to the conductivity type of the differential stage transistors and having a main path electrode connected to the control electrode of the third load transistor and a second main path electrode connected via a second current source to the first supply voltage pole.

17. An electric regulating circuit including a hysteresis comparator circuit for ascertaining in a virtually power-free manner a voltage value to be used for comparison, comprising:

load stage with load transistors;

a differential stage coupled to the load stage; and a impedance stage coupled to the differential stage;

wherein a control electrode of a first load transistor, which is a transistor with high input impedance, having an input voltage applied thereto that is to be used for the comparison, and a control electrode of a second load transistor having a reference voltage applied thereto on the basis of which the second load transistor forms a constant load impedance, a third load transistor connected in parallel with the second load transistor, the third load transistor conducting or blocking depending on an output signal of the comparator circuit, so that in accordance with the output signal of the comparator circuit an impedance of the second load transistor has an additional load impedance connected in parallel thereto or no such connection is made.

18. A regulating circuit according to claim 17, for regulating a pumping voltage of a voltage pumping circuit that is higher than the supply voltage value of a first supply voltage pole, to a predetermined pumping voltage value, wherein:

(a) the voltage pumping circuit comprises a pumping voltage accumulator connected to have applied on an input side a charging alternating current voltage from a controllable pumping circuit switch means, with the accumulated pumping voltage increasing when the pumping circuit switch means is controlled to a conducting state, and the accumulated pumping voltage decreasing in accordance with a specific discharging time constant when the pumping circuit switch means is not controlled to the conducting state; and (b) a switching control input of the pumping circuit switch means is coupled to the comparator output and an output of the pumping voltage accumulator delivering the pumping voltage is coupled to a comparator input.

19. An EMR-reducing hysteresis comparator circuit comprising:

a differential stage for comparing a first load to a second load;

the first load made from a resistance actively changing as a voltage level to be compared changes;

the second load made from a resistance with a static first value and a static second value; and an impedance stage to provide a return path for the comparator circuit;

whereby when the first load equals the second load the comparator circuit output changes from an original state to a second state and the second load changes from the first value to the second value, additionally the second comparator output state prevents oscillations in the voltage level to be compared;

subsequently when the first load equals the new second value of the second load, the comparator output returns to the original state, the second load returns to the first value, and the oscillations in the voltage level to be compared resume.

20. The circuit of claim 19 wherein the resistance actively changing is caused by the voltage level to be compared applied to a transistor, the static first value is caused by a second voltage applied to a second transistor and the static second value is caused by a third voltage applied to a third transistor, the second transistor and the third transistor being connected in parallel to each other.

21. A method for reducing EMR in a comparator circuit comprising the steps of:

comparing an actively changing voltage value to a static pre-set voltage value;

changing a comparator output from an original state to a second state when the actively changing voltage value equals the static pre-set voltage value;

changing the pre-set voltage value to a second pre-set voltage value when the comparator output changes;

disabling oscillations in the actively changing voltage when the comparator output changes to the second state;

comparing the actively changing voltage value to the second pre-set voltage value;

returning the comparator output to the original state when the actively changing voltage value equals the second pre-set voltage value;

resuming oscillations in the actively changing voltage value when the comparator output resumes the original state.

22. The method according to claim 21, further including converting the voltages to be compared to resistances by applying the voltages to be compared to separate transistors, and comparing these resistances.

23. The method according to claim 21, further including changing the pre-set voltage and changing second pre-set voltage during circuit operation.

24. A comparator circuit comprising:

a differential stage for comparing a variable load to a second load having a first and a second value;

a oscillator connected to the variable load for varying the load;

an output stage coupled to the differential stage for providing a first signal when the variable load is less than the first value of the second load, and for providing a second signal when the variable load is greater than the second value of the second load, wherein the output stage does not change signals when the variable load is between the first and second valves of the second load; and a switch coupled to the output stage for connecting the oscillator to the variable load when it receives the first signal and for disconnecting the oscillator from the variable load when it receives the second signal.

25. The comparator circuit of claim 24 further comprising a current mirror stage coupled between the differential stage and a ground voltage.

26. The comparator circuit of claim 24 wherein the variable load and the second load are made up of MOS transistors.

27. The comparator of claim 26 wherein the variable load is made of an NMOS transistor and the second load is made of two PMOS transistors, connected in parallel.

28. The comparator of claim 24 wherein the differential stage is made from two bi-polar transistors.

29. The comparator of claim 28 wherein the two differential stage transistors are each multi-collector transistors.

* * * * *